United States Patent

Kawami et al.

[11] Patent Number: 5,882,761
[45] Date of Patent: *Mar. 16, 1999

[54] ORGANIC EL ELEMENT

[75] Inventors: Shin Kawami; Hitoshi Nakada, both of Tsurugashima; Takemi Naito, Yonezawa, all of Japan

[73] Assignees: Pioneer Electronic Corporation, Tokyo-to; Tohoku Pioneer Electronic Corporation, Yamagata-ken, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 746,977

[22] Filed: Nov. 19, 1996

[30] Foreign Application Priority Data

Nov. 24, 1995 [JP] Japan ..................................... 7-306143

[51] Int. Cl.⁶ ...................................................... H01J 1/52
[52] U.S. Cl. .............................. 428/69; 428/76; 428/917; 252/301.16; 313/506; 313/512

[58] Field of Search ................................. 428/69, 76, 917; 252/301.16; 313/506, 512

[56] References Cited

U.S. PATENT DOCUMENTS 4,229,709  10/1980  McMahan .............................. 331/94.5
4,318,722   3/1982  Altman ......................................... 62/3

FOREIGN PATENT DOCUMENTS 3-261091  11/1991  Japan ............................. H05B 33/04

*Primary Examiner*—Christopher Raimund
*Attorney, Agent, or Firm*—Kane, Dalsimer, Sullivan, Kurucz, Levy, Eisele and Richard, LLP

[57] ABSTRACT

An organic electro-luminescent element is provided with a drying substance contained in an airtight container and spaced from the element in an internal space of the airtight container for absorbing moisture in the internal space. The drying substance comprises a solid compound which chemically absorbs the moisture and maintains its solid state even after absorbing the moisture.

15 Claims, 1 Drawing Sheet

ORGANIC EL ELEMENT

BACKGROUND OF THE INVENTION

1. Field of the Invention

The present invention generally relates to an organic EL (Electro-Luminescence) element suitably used for a display device, a light emission element, etc. of apparatuses for various information industries, and more particularly to an organic EL element, which can maintain a stable light emission property for a long period of time.

2. Description of the Related Art

The EL element is constructed such that an organic luminescent material layer is interposed between a pair of electrodes opposed to each other. By injecting the electrons from one of the electrodes and injecting the holes from the other of the electrodes to the organic luminescent material layer, the electrons and the holes are combined in the organic luminescent material layer, so that the EL element emits the light. The EL element is superior in the visibility and the endurance against a physical shock, and also has a merit of the high variety in colors of emitted light from the organic material forming the organic luminescent material layer, so that it is suitably used for a display device and a light emission element of apparatuses for various information industries, for example.

On the other hand, the organic EL element has such a demerit that, after it has been driven for a certain period of time, the light emission properties such as a light emission intensity and a light emission uniformity are considerably degraded as compared with those at the initial state. One of the reasons for this degradation of the light emission properties is that the moisture, which has been absorbed on a surface of a constitutional part of the organic EL element, and the moisture, which has invaded into the organic EL element, invades through a defect etc. Of the surface of a cathode into the lamination body, which has a pair of electrodes (i.e. the cathode and anode) and the organic luminescent material layer interposed therebetween, so that the detachment between the organic luminescent material layer and the cathode is caused. As a result, a so-called dark spot, i.e. a spot of the light emission portion, which does not emit the light because the electricity is not supplied thereto, is generated.

Therefore, it is necessary to decrease the humidity in the internal of the organic EL element so as to prevent the generation of the dark spots.

In order to prevent the internal of the organic EL element from becoming a high humidity condition, there is proposed one method, which has such a construction that a sealing layer and a protection layer including a drying agent are disposed at the external of the lamination body of the cathode, the organic luminescent material layer and the anode (Japanese Patent Application Laying Open NO. Hei. 7-169567). There is also proposed another method, which has such a construction that the lamination body of the pair of electrodes opposed to each other and the organic luminescent material layer interposed therebetween is accommodated in an airtight case, and that drying means composed of phosphorus pentoxide ($P_2O_5$) is accomodated in the airtight case and is spaced from the lamination body, so that the lamination body and the drying means are midair-sealed in the airtight case (Japanese Patent Application Laying Open NO. Hei. 3-261091).

However, the above mentioned organic EL element, which has the construction that the sealing layer and the protection layer including the drying agent are directly laminated on the external of the lamination body (Japanese Patent Application Laying Open NO. Hei. 7-169567), a leak current and a cross-talk can be easily generated because of the formation of the protection layer, so that it considerably degrades the light emission property.

On the other hand, the above mentioned organic EL element, which has such a construction that the lamination body and the drying means composed of $P_2O_5$, are accommodated in the airtight case (Japanese Patent Application Laying Open NO. Hei. 3-261091), although it does not have such a problem that the leak current or the cross-talk is easily generated, $P_2O_5$, absorbs the moisture in the atmosphere and is dissolved into the absorbed water (deliquesconce), so that phosphoric acid is generated, which badly influences the lamination body. Further, since the method of enclosing the drying means composed of $P_2O_5$ into the airtight case is extremely limited, this organic EL element is not practical.

SUMMARY OF THE INVENTION

It is therefore an object of the present invention to provide an organic EL element, in which the generation of the leak current or the cross-talk is restrained, which has the drying means harmless for the organic EL element and is easily handled at the time of enclosing the drying means, and which can maintain a stable light emission property for a long period of time.

The above object of the present invention can be achieved by an organic EL element provided with: a lamination body having a pair of electrodes opposed to each other and an organic luminescent material layer, which comprises an organic compound and is interposed between the pair of electrodes, for emitting a light from the organic luminescent material layer by supplying electrons and holes to the organic luminescent material layer from the pair of electrodes; an airtight container for airtightly containing the lamination body to isolate the lamination body from an external atmosphere thereof; and a drying substance airtightly contained in the airtight container and spaced from the lamination body in an internal space of the airtight container, for absorbing moisture in the internal space. The drying substance comprises a solid compound which chemically absorbs the moisture and maintains its solid state even after absorbing the moisture.

According to the present invention, the solid compound, which chemically absorbs the moisture and maintains its solid state even after absorbing the moisture, is used for the drying substance, in the construction of the organic EL element in which the drying substance and the lamination body are airtightly contained in the airtight container such that the drying substance is spaced from the lamination body in the internal space.

Thus, since the moisture is chemically absorbed, the solid compound of the drying substance does not discharge the moisture, which has been once absorbed, to the internal space of the airtight container even at a high temperature. As a result, the growth of the dark spot of the organic EL element can be sufficiently restrained. On the contrary to this, if the solid compound, which physically absorbs the moisture such as silica gel, is used to absorb the moisture, the drying substance certainly discharges the moisture, which has been once absorbed, to the internal space of the airtight container, at a high temperature. As a result, the growth of the dark spot of the organic EL element cannot be sufficiently restrained.

Further, since the solid compound of the drying substance maintains its solid state even after absorbing the moisture, the drying substance does not badly influence the lamination body even after absorbing the moisture. Namely, the solid compound certainly prevents the high humidity condition from occurring in the organic EL element so as to prevent the generation of the leak current and the cross-talk, and does not cause the leak current or the cross-talk even after absorbing the moisture. On the contrary to this, if the drying substance is composed of a compound which liquefies after absorbing the moisture, although it works in its initial state, it will badly influence the organic EL element after liquefying in the container.

Furthermore, since the solid compound is certainly in a solid state at the time of enclosing it into the airtight container, the handling at the time of enclosing the drying substance is rather easy, and various enclosing methods may be employed. On the contrary to this, if the drying substance is composed of a compound, which liquefies after absorbing the moisture, or a liquid compound from its original state, the handling at the time of enclosing the drying substance is rather difficult, and the enclosing method is quite limited in a practical sense.

Consequently, the generation and growth of the dark spots can be surely restrained after driving it for a certain period of time, and the stable light emission property can be maintained for a long period of time, according to the present invention.

In one aspect of the present invention, the lamination body further has an electron supplying layer and a holes supplying layer laminated on the pair of electrodes for respectively supplying the electrons and the holes.

According to this aspect, the electron and the holes can be reliably supplied to the pair of electrodes, so that the light can be reliably emitted from the organic luminescent material layer.

In another aspect of the present invention, the airtight container is provided with: a sealing case, in which the drying substance is disposed; a transparent substrate, on which the lamination body is disposed and which covers the sealing case; and a sealing agent for airtightly bonding the transparent substrate to the sealing case.

According to this aspect, the reliable airtight condition of the airtight container can be obtained by use of a rather simple construction, and the production procedure of the organic EL element can be simplified.

In another aspect of the present invention, the internal space of the airtight container is filled with inert gas.

According to this aspect, the drying substance, which is spaced from the lamination body in the internal space of the airtight container, can be certainly isolated from the lamination body by the existence of the internal space filled with the inert gas.

In the present invention, the solid compound of the drying substance may comprise an alkaline metal oxide compound, an alkaline earth metal oxide compound, sulfate, metal halide, perchlorate or an organic substance. In this manner, various kinds of solid compounds can be employed in the present invention, as long as they have the property to chemically absorb the moisture and maintain its solid state even after absorbing the moisture.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

Figure 1:
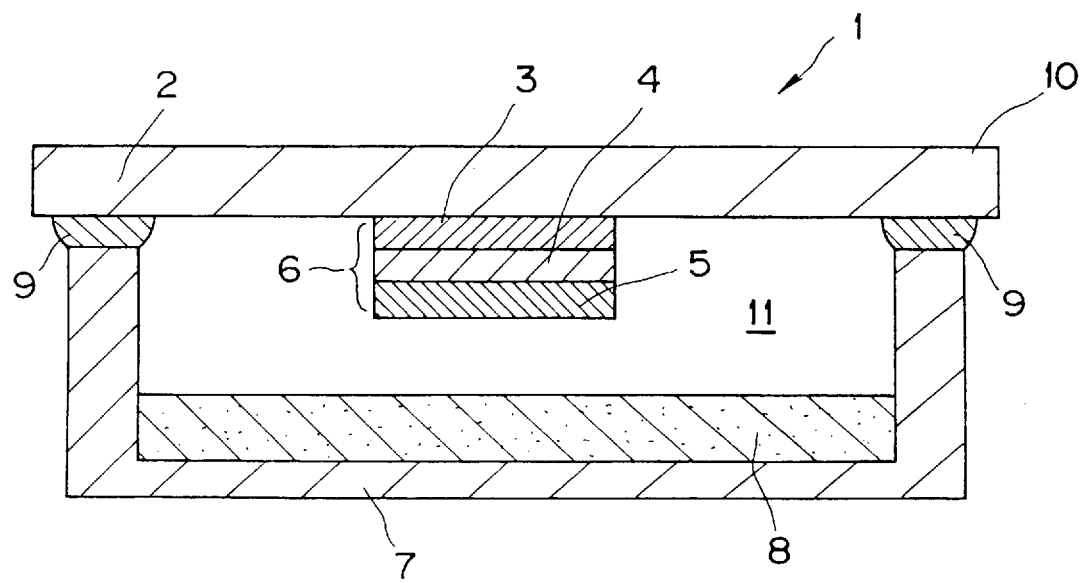
FIG. 1 is a cross-sectional view of an organic EL element as an embodiment of the present invention.

In FIG. 1 an organic EL element 1 as an embodiment of the present invention is provided with: a glass substrate 2; a lamination body 6 comprising an ITO electrode (i.e. $In_2O_3$:Sn film electrode) 3, an organic luminescent material layer 4 and a cathode 5; a glass sealing case 7; a drying substance 8; and a sealing agent 9.

Figure 2:
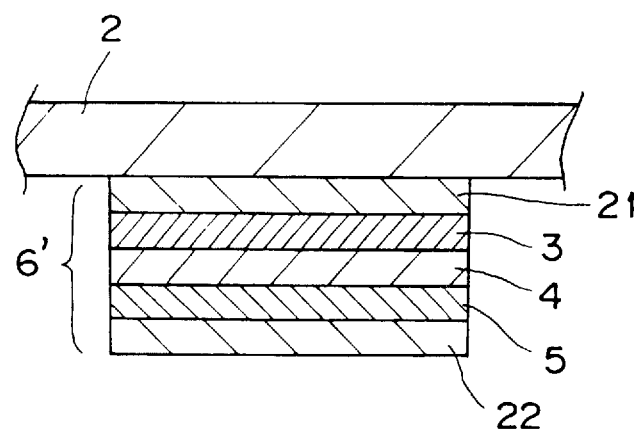
FIG. 2 is a partial cross-sectional view of a modified lamination body of the organic EL element of FIG. 1.

Although the lamination body 6 comprises three laminated layers i.e., the ITO electrode 3, the organic luminescent material layer 4 and the cathode 5 in FIG. 1, the lamination body 6 may further comprise a hole supplying layer 21 and an electron supplying layer 22 in addition to those three layers, and that those layers may comprise multiple layers, to be a lamination body 6' having a construction as shown in FIG. 2.

In FIG. 1, more concretely, the ITO electrode 3, the organic luminescent material layer 4 and the cathode 5 are laminated in this order on the glass substrate 2 to form the lamination body 6. The drying substance 8 is disposed in the glass sealing case 7 such that the drying substance 8 is spaced from the lamination body 6. The lamination body 6 and the drying substance 8 are enclosed in an internal space 11 of an airtight container 10 composed of the glass substrate 2 and the glass sealing case 7, which are airtightly bonded to each other by the sealing agent 9.

The internal space 11 of the airtight container 10 is filled with dried inert gas to isolate the drying substance 8 from the lamination body 6. The drying substance 8 comprises a solid compound, which chemically absorbs moisture and maintains its sold state even after absorbing the moisture.

As such a solid compound of the drying substance 8, as long as it chemically absorbs moisture and maintains its solid state even after absorbing the moisture, any solid compound can be used here.

For example, an alkaline metal oxide compound, an alkaline earth metal oxide compound, sulfate (sulphate), metal halide (halogenide), perchlorate and an organic substance are available as such a solid compound of the drying substance 8.

As the alkaline metal oxide compound, sodium oxide ($Na_2O$) and potassium oxide ($K_2O$) are available, for example. As the alkaline earth metal oxide compound, calcium oxide (CaO), barium oxide (BaO) and magnesium oxide (MgO) are available, for example.

As the sulfate, lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) and nickel sulfate ($NiSO_4$) are available, for example. The anhydrides of these sulfates are preferably employed here.

As the metal halide, calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), calcium bromide ($CaBr_2$), cesium bromide ($CsBr_3$), selenium bromide ($SeBr_4$), vanadium bromide ($VBr_2$), magnesium bromide ($MgBr_2$), barium iodide ($BaI_2$) and magnesium iodide ($MgI_2$) are available, for example. The anhydrides of these halides are preferably employed here.

As the perchlorate, barium perchlorate ($Ba(ClO_4)_2$) and magnesium perchlorate ($Mg(ClO_4)_2$) are available, for example. The anhydrides of these perchlorates are preferably employed here.

Further, other than the above described inorganic compounds, the organic substance is also available for the drying substance 8. However, in case of the organic substance, the property is still required to chemically absorb moisture and maintain its solid state even after absorbing the moisture.

As a method of enclosing the drying substance 8 in the airtight container 10, a method of consolidating the above explained chemical compound to be a solid compound formed in a predetermined shape and setting this solid compound in the glass sealing case 7, a method of packing the above explained chemical compound into an air-permeable bag and fixing the bag in the glass sealing case 7, a method of preparing a partition in the glass sealing case 7 and enclosing the above explained chemical compound into this partition, and a method of forming a film of the above explained chemical compound, by a vacuum-vapor deposition, a spattering, a spinner-coating and so on, on the internal surface of the glass sealing case 7, are available, for example.

As explained above, since the drying substance 8, which has the property to chemically absorb moisture and maintain its solid state even after absorbing the moisture, is used for the organic EL element 1, handling at the time of enclosing the drying substance 8 into it is rather easy, and a more simple or functional enclosing method can be employed.

Concrete examples of the present embodiment will be explained hereinbelow.

1. FIRST EXAMPLE

As the drying substance 8, the barium oxide (BaO) is used, and the organic EL element 1 having the structure shown in FIG. 1 is constructed as a first example. The drying substance 8 is enclosed in the glass sealing case 7 by fixing the drying substance 8 on the internal surface of the glass sealing case 7 by use of a bonding agent.

Right after enclosing the drying substance 8, a magnified photograph of a light emission portion of the organic EL element 1 is taken by a magnification of 50 times.

Nextly, after keeping this organic EL element 1 at a temperature of 85° C. for 500 hours, the magnified photograph of the light emission portion of the organic EL element 1 is taken in the same manner as right after enclosing.

By observing and comparing those two magnified photographs, the growth of dark spots is hardly observed.

2. SECOND EXAMPLE

As the drying substance 8, in place of the barium oxide (BaO) in the first example, the calcium oxide (CaO) is used. Other than that, the organic EL element 1 is constructed and the magnified photographs (right after enclosing and after keeping it at the temperature of 85° C. for 500 hours) are taken in the same manner as the first example.

As a result, the growth of dark spots is hardly observed.

3. THIRD EXAMPLE

As the drying substance 8, in place of the barium oxide (BaO) in the first example, the calcium sulfate ($CaSO_4$) is used. Other than that, the organic EL element 1 is constructed and the magnified photographs (right after enclosing and after keeping it at the temperature of 85° C. for 500 hours) are taken in the same manner as the first example.

As a result, the growth of dark spots is hardly observed.

4. FOURTH EXAMPLE

As the drying substance 8, in place of the barium oxide (BaO) in the first example, the calcium chloride ($CaCl_2$) is used. Other than that, the organic EL element 1 is constructed and the magnified photographs (right after enclosing and after keeping it at the temperature of 85° C. for 500 hours) are taken in the same manner as the first example.

As a result, the growth of dark spots is hardly observed.

5. COMPARISON EXAMPLE

As the drying substance 8, in place of the barium oxide (BaO) in the first example, the silica gel is used. Other than that, the organic EL element 1 is constructed and the magnified photographs (right after enclosing and after keeping it at the temperature of 85° C. for 500 hours) are taken in the same manner as the first example.

As a result, it is observed that the growth of dark spots is remarkable.

As described above in detail, according to the present embodiment, the drying substance 8 has the property to chemically absorb moisture and maintain its solid state even after absorbing the moisture, and since this drying substance 8 is enclosed in the airtight container 10 in such a manner that the drying substance 8 is isolated from the lamination body 6, which comprises the pair of electrodes opposed to each other and the organic luminescent material layer interposed therebetween, by the internal space 11 filled with the inert gas. Thus, the drying substance 8 after absorbing the moisture dose not badly influence the organic EL element 1, and the handling at the time of enclosing the drying substance 8 is rather easy. Further, since the generation of the leak current and the cross-talk is certainly restrained, the stable light emission property can be maintained for a long period of time.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An organic EL element comprising:
   a lamination body comprising a pair of electrodes opposed to each other and an organic luminescent material layer, which comprises an organic compound and is interposed between said pair of electrodes, for emitting a light from said organic luminescent material layer by supplying electrons and holes to said organic luminescent material layer from said pair of electrodes;
   an airtight container for airtightly containing said lamination body to isolate said lamination body from an external atmosphere thereof; and
   a drying substance airtightly contained in said airtight container and spaced from said lamination body in an internal space of said airtight container, for absorbing moisture in the internal space, said drying substance comprising a solid compound which is formed in a predetermined shape, is fixed on an internal surface of said airtight container by use of a bonding agent, chemically absorbs the moisture and maintains its solid state even after absorbing the moisture.

2. An organic EL element according to claim 1, wherein said lamination body further comprises an electron supplying layer and a holes supplying layer laminated on said pair of electrodes for respectively supplying the electrons and the holes.

3. An organic EL element according to claim 1, wherein said airtight container comprises: a sealing case, in which said drying substance is disposed; a transparent substrate, on which said lamination body is disposed and which covers said sealing case; and a sealing agent for airtightly bonding said transparent substrate to said sealing case.

4. An organic EL element according to claim 1, wherein the internal space of said airtight container is filled with inert gas.

5. An organic EL element according to claim 1, wherein the solid compound of said drying substance comprises an alkaline metal oxide compound.

6. An organic EL element according to claim 1, wherein the solid compound of said drying substance comprises an alkaline earth metal oxide compound.

7. An organic EL element according to claim 1, wherein the solid compound of said drying substance comprises sulfate.

8. An organic EL element according to claim 1, wherein the solid compound of said drying substance comprises metal halide.

9. An organic EL element according to claim 1, wherein the solid compound of said drying substance comprises perchlorate.

10. An organic EL element according to claim 1, wherein the solid compound of said drying substance comprises an organic substance.

11. An organic EL element according to claim 6, wherein the alkaline earth metal oxide compound comprises barium oxide (BaO).

12. An organic EL element according to claim 1, wherein said airtight container comprises:

a sealing case having a bottom wall and a side wall standing from a peripheral edge of the bottom wall, in which said drying substance is fixed on an upper surface of the bottom wall; and a transparent substrate, on which said lamination body is disposed and which covers said sealing case at an upper edge face of the side wall such that the lamination body is opposed to and spaced from the drying substance in the internal space.

13. An organic EL element comprising:

a lamination body comprising a pair of electrodes opposed to each other and an organic luminescent material layer, which comprises an organic compound and is interposed between said pair of electrodes, for emitting a light from said organic luminescent material layer by supplying electrons and holes to said organic luminescent material layer from said pair of electrodes;

an airtight container for airtightly containing said lamination body to isolate said lamination body from an external atmosphere thereof; and a drying substance airtightly contained in said airtight container and spaced from said lamination body in an internal space of said airtight container, for absorbing moisture in the internal space, said drying substance comprising a solid compound which is packed in an air-permeable bag, is fixed at the air-permeable bag on an internal surface of said airtight container, chemically absorbs the moisture and maintains its solid state even after absorbing the moisture.

14. An organic EL element comprising:

a lamination body comprising a pair of electrodes opposed to each other and an organic luminescent material layer, which comprises an organic compound and is interposed between said pair of electrodes, for emitting a light from said organic luminescent material layer by supplying electrons and holes to said organic luminescent material layer from said pair of electrodes;

an airtight container for airtightly containing said lamination body to isolate said lamination body from an external atmosphere thereof; and a drying substance airtightly contained in said airtight container and spaced from said lamination body in an internal space of said airtight container, for absorbing moisture in the internal space, said drying substance comprising a solid compound which is enclosed into a partition of said airtight container at a side thereof opposed to said lamination body, chemically absorbs the moisture and maintains its solid state even after absorbing the moisture.

15. An organic EL element comprising:

a lamination body comprising a pair of electrodes opposed to each other and an organic luminescent material layer, which comprises an organic compound and is interposed between said pair of electrodes, for emitting a light from said organic luminescent material layer by supplying electrons and holes to said organic luminescent material layer from said pair of electrodes;

an airtight container for airtightly containing said lamination body to isolate said lamination body from an external atmosphere thereof; and a drying substance airtightly contained in said airtight container and spaced from said lamination body in an internal space of said airtight container, for absorbing moisture in the internal space, said drying substance comprising a solid compound which is formed as a film by one of a vacuum-vapor deposition, a spattering and spinner-coating on an internal surface of said airtight container, chemically absorbs the moisture and maintains its solid state even after absorbing the moisture.

* * * * *